(12) United States Patent
Baker et al.

(10) Patent No.: US 8,128,756 B2
(45) Date of Patent: *Mar. 6, 2012

(54) TECHNIQUE FOR THE GROWTH OF PLANAR SEMI-POLAR GALLIUM NITRIDE

(75) Inventors: Troy J. Baker, Santa Barbara, CA (US); Benjamin A. Haskell, Santa Barbara, CA (US); Paul T. Fini, Santa Barbara, CA (US); Steven P. DenBaars, Goleta, CA (US); James S. Speck, Goleta, CA (US); Shuji Nakamua, Santa Barbara, CA (US)

(73) Assignees: The Regents of the University of California, Oakland, CA (US); Japan Science and Technology Agency, Kawaguchi, Saitama Prefecture (JP)

( * ) Notice: Subject to any disclaimer, the term of this patent is extended or adjusted under 35 U.S.C. 154(b) by 35 days.

This patent is subject to a terminal disclaimer.

(21) Appl. No.: 12/697,961

(22) Filed: Feb. 1, 2010

(65) Prior Publication Data

US 2010/0133663 A1    Jun. 3, 2010

Related U.S. Application Data

(63) Continuation of application No. 11/621,482, filed on Jan. 9, 2007, now Pat. No. 7,704,331, which is a continuation of application No. 11/372,914, filed on Mar. 10, 2006, now Pat. No. 7,220,324.

(60) Provisional application No. 60/660,283, filed on Mar. 10, 2005.

(51) Int. Cl.
   *H01L 21/205* (2006.01)

(52) U.S. Cl. ............ 148/33; 438/46; 438/47; 438/479; 438/938; 257/E21.113; 257/E21.463; 117/101

(58) Field of Classification Search .............. 438/46, 438/47, 479, 938; 257/E21.113, E21.463; 148/33; 117/101
See application file for complete search history.

(56) References Cited

U.S. PATENT DOCUMENTS

| | | | |
|---|---|---|---|
| 6,153,010 A | 11/2000 | Kiyoku et al. | |
| 6,218,280 B1 | 4/2001 | Kryliouk et al. | |
| 6,440,823 B1 | 8/2002 | Vaudo et al. | |
| 6,599,362 B2 | 7/2003 | Ashby et al. | |
| 6,847,057 B1 | 1/2005 | Gardner et al. | |
| 7,009,215 B2 | 3/2006 | D'Evelyn et al. | |
| 7,220,324 B2 | 5/2007 | Baker et al. | |
| 7,361,576 B2 | 4/2008 | Imer et al. | |
| 7,575,947 B2 | 8/2009 | Iza et al. | |
| 7,691,658 B2* | 4/2010 | Kaeding et al. ............ | 438/46 |
| 7,846,757 B2* | 12/2010 | Farrell et al. ............ | 438/46 |
| 2002/0074561 A1 | 6/2002 | Sawaki et al. | |
| 2003/0015708 A1 | 1/2003 | Parikh et al. | |
| 2003/0178702 A1 | 9/2003 | Sawaki et al. | |
| 2003/0198837 A1 | 10/2003 | Craven et al. | |
| 2003/0230235 A1 | 12/2003 | Craven et al. | |
| 2004/0238810 A1 | 12/2004 | Dwilinski et al. | |
| 2004/0245535 A1 | 12/2004 | D'Evelyn et al. | |
| 2004/0251471 A1 | 12/2004 | Dwilinski et al. | |
| 2004/0261692 A1 | 12/2004 | Dwilinski et al. | |
| 2005/0214992 A1 | 9/2005 | Chakraborty et al. | |
| 2006/0008941 A1 | 1/2006 | Haskell et al. | |
| 2006/0138431 A1 | 6/2006 | Dwilinski et al. | |
| 2007/0022940 A1 | 2/2007 | Boussagol et al. | |
| 2007/0093073 A1 | 4/2007 | Farrell et al. | |
| 2007/0111531 A1 | 5/2007 | Baker et al. | |
| 2007/0190758 A1* | 8/2007 | Kaeding et al. ............ | 438/510 |
| 2007/0218703 A1 | 9/2007 | Kaeding et al. | |
| 2007/0252164 A1 | 11/2007 | Zhong et al. | |
| 2008/0163814 A1 | 7/2008 | Kim et al. | |
| 2008/0179607 A1 | 7/2008 | DenBaars et al. | |
| 2008/0224268 A1 | 9/2008 | Abe et al. | |
| 2008/0230766 A1 | 9/2008 | Okamoto et al. | |
| 2009/0081857 A1 | 3/2009 | Hanser et al. | |
| 2009/0134410 A1 | 5/2009 | Paek et al. | |
| 2009/0146162 A1 | 6/2009 | Chakraborty et al. | |
| 2009/0146185 A1 | 6/2009 | Suh et al. | |
| 2009/0155947 A1 | 6/2009 | Paek et al. | |
| 2009/0168453 A1 | 7/2009 | Koike et al. | |
| 2009/0250686 A1 | 10/2009 | Sato et al. | |

FOREIGN PATENT DOCUMENTS

| | | |
|---|---|---|
| EP | 0383215 | 8/1990 |
| EP | 1385196 | 1/2004 |
| WO | 03/089694 | 10/2003 |

OTHER PUBLICATIONS

Kamiyama, S., et al., "GaN growth on (3038) 4H-SiC substrate for reduction of internal polarization", Phys. Stat. Sol. (c)2, No. 7, pp. 2121-2124 (2005).*

Amimer et al., "Single-crystal hexagonal and cubic GaN growth directly on vicinal (001) GaAs substrates by molecular beam epitaxy," Appl. Phys. Lett., vol. 76, No. 18, May 1, 2000, pp. 2580-2582.

(Continued)

*Primary Examiner* — George Fourson, III
(74) *Attorney, Agent, or Firm* — Gates & Cooper LLP

(57) ABSTRACT

A method for growing planar, semi-polar nitride film on a miscut spinel substrate, in which a large area of the planar, semi-polar nitride film is parallel to the substrate's surface. The planar films and substrates are: (1) {10$\bar{1}$1} gallium nitride (GaN) grown on a {100} spinel substrate miscut in specific directions, (2) {10$\bar{1}$3} gallium nitride (GaN) grown on a {110} spinel substrate, (3) {11$\bar{2}$2} gallium nitride (GaN) grown on a {1$\bar{1}$00} sapphire substrate, and (4) {10$\bar{1}$3} gallium nitride (GaN) grown on a {1$\bar{1}$00} sapphire substrate.

16 Claims, 3 Drawing Sheets

OTHER PUBLICATIONS

Bauer et al., "Optical properties of aluminum nitride prepared by chemical plastachemical vapour deposition," Physica Status Solidi (A), vol. 39, Jan. 16, 1997, pp. 173-181.

Funato et al., "Blue, green, and amber InGaN/GaN light-emitting diodes on semipolar {11-22} GaN bulk substrates," Jap. Journal of Appl. Phys., vol. 45, No. 26, 2006, pp. L659-L662.

Gu et al., "The impact of initial growth of substrate nitridation on thick GaN growth on sapphire by hydride vapor phase epitaxy," Journal of Crystal Growth, vol. 231, No. 3, Oct. 2001, pp. 342-351.

Hwang et al., "Heteroepitaxy of gallium nitride on (0001), (-1012) and (10-10) sapphire surfaces," Journal of Crystal Growth, vol. 142, Sep. 1, 1994, pp. 5-14.

Ilegems, "Vapor epitaxy of gallium nitride," Journal of Crystal Growth, vol. 13/14, May 1, 1972, pp. 360-364.

"Kyma Technologies announces improved and expanded native gallium nitride product line," Mar. 20, 2006, Company News Release, retrieved from http://www.compoundsemi.com/documents/articles/cldoc/6524.html.

McMahon, "Dr. Shuji Nakamura and UCSB research team report first nonpolar and semi-polar GaN LEDs," Compoundsemi Online, Mar. 24, 2006, one page.

Neubert, "Growth characteristics of GaInN quantum wells on semipolar GaN facets," Annual Report 2005, Optoelectronics Department, University of Ulm, 2006, pp. 1-6.

Nishizuka et al., "Efficient radiative recombination from . . . fabricated by the regrowth technique," Appl. Phys. Lett., vol. 85, No. 15, Oct. 11, 2004, pp. 3122-3125.

Patent Abstracts of Japan, vol. 2002, No. 4, Aug. 4, 2002 & JP 2001 342100 A (Toshiba Corp.), Dec. 11, 2001.

Sharma, "Demonstration of semipolar (1013) InGaN/GaN green light emitting diode," Applied Physics Letters, Nov. 2005, vol. 87, 231110, pp. 1-3, abstract.

Tempel et al., "Zur epitaxie von Galliumnitrid auf nichtstochiometrischem Spinell im system GaCl/NH3/He," vol. 10, 1975, pp. 747-758.

Baker, T. et al., "Characterization of planar semipolar gallium nitride films on sapphire substrates," Japanese Journal of Applied Physics, vol. 45, No. 6, 2006, pp. L154-L157.

Baker, T. et al., "Characterization of planar semipolar gallium nitride films on spinel substrates," Japanese Journal of Applied Physics, vol. 44, No. 29, 2005, pp. L920-L922.

Chakraborty, A. et al., "Milliwatt power blue InGaN/GaN light-emitting diodes on semipolar GaN templates," Japanese Journal of Applied Physics, vol. 44, No. 30, 2005, pp. L945-L947.

Takeuchi, T. et al., "Theoretical study of orientation dependence of piezoelectric effects in wurtzite strained GaInN/GaN heterostructures and quantum wells," Jpn. J. Appl. Phys., vol. 39, Feb. 2000, pp. 413-416.

CN Office Action dated Jan. 27, 2011, CN application No. 1010111379.5, with translation.

European search report dated Mar. 18, 2011, EP application No. 10014011.0.

Bauer, J., et al., "Optical properties of aluminium nitride prepared by chemical and plasmachemical vapour deposition", Physica Status Solidi (A), vol. 39, Jan. 16, 1977, pp. 173-181, XP002509068.

Hwang, et al., "Heteroepitaxy of gallium nitride on (0001), (-1012) and (10-10) sapphire surfaces", Journal of Crystal Growth, vol. 142, Sep. 1, 1994, pp. 5-14, XP002509067.

Ilegems, M., "Vapor epitaxy of gallium nitride", Journal of Crystal Growth, vol. 13/14, May 1, 1972, pp. 360-364, XP002509751.

Nishizuka, K., et al., "Efficient radiative recombination from <1122>-oriented $In_xGa_{1-x}N$ multiple quantum wells fabricated by the regrowth technique", Applied Physics Letters, AIP, American Institute of Physics, Mellville, NY, US, vol. 85, No. 15, Oct. 11, 2004, pp. 3122-3124, XP008134126, ISSN: 0003-6951, DOI: DOI:10.1062/1.1806266.

Park, Seoung-Hwan, "Crystal orientation effects on electronic properties of wurtzite InGaN/GaN quantum wells", Journal of Applied Physicas, American Institute of Physics, New York, US vol. 91, No. 12 Jun. 15, 2002, pp. 9904-9908, XP012055516, ISSN: 0021-8979, DOI: DOI:10.1063/1.1480465.

Tempel, A., et al., "Zur epitaxie von Galliumnitrid auf nichtstochiometrischem Spinell im system GaC1/NH3/He", Kristall und Technik, vol. 10, 1975, pp. 747-758, XP002509066.

EP Communication (Summons) dated Mar. 24, 2011 (EP Application No. 06737745.7).

* cited by examiner

TECHNIQUE FOR THE GROWTH OF PLANAR SEMI-POLAR GALLIUM NITRIDE

CROSS-REFERENCE TO RELATED APPLICATIONS

This application is a continuation under 35 U.S.C. §120 of and commonly-assigned U.S. Utility patent application Ser. No. 11/621,482, filed on Jan. 9, 2007 now U.S. Pat. No. 7,704,331, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,"which application is a continuation under 35 U.S.C. §120 of U.S. Utility patent application Ser. No. 11/372,914, filed on Mar. 10, 2006 now U.S. Pat. No. 7,220,324, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,"now issued as U.S. Pat. No. 7,220,324 on May 22, 2007, which application claims the benefit under 35 U.S.C. §119(e) of U.S. Provisional Patent Application Ser. No. 60/660,283, filed on Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,"; all of which applications are incorporated by reference herein.

This application is related to the following co-pending and commonly-assigned applications:

U.S. Provisional Patent Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES,";

U.S. Provisional Patent Application Ser. No. 60/698,749, filed on Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS,";

U.S. Provisional Patent application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION,";

U.S. Provisional Patent Application Ser. No. 60/760,739, filed on Jan. 20, 2006, by John F. Kaeding, Michael Iza, Troy J. Baker, Hitoshi Sato, Benjamin A. Haskell, James S. Speck, Steven P. DenBaars, and Shuji Nakamura, entitled "METHOD FOR IMPROVED GROWTH OF SEMIPOLAR (Al, In, Ga, B)N,";

U.S. Provisional Patent Application Ser. No. 60/760,628, filed on Jan. 20, 2006, by Hitoshi Sato, John F. Keading, Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION,";

U.S. Provisional Patent Application Ser. No. 60/772,184, filed on Feb. 10, 2006, by John F. Kaeding, Hitoshi Sato, Michael Iza, Hirokuni Asamizu, Hong Zhong, Steven P. DenBaars, and Shuji Nakamura, entitled "METHOD FOR CONDUCTIVITY CONTROL OF SEMIPOLAR (Al, In, Ga, B)N,";

U.S. Provisional Patent Application Ser. No. 60/774,467, filed on Feb. 17, 2006, by Hong Zhong, John F. Kaeding, Rajat Sharma, James S. Speck, Steven P. DenBaars, and Shuji Nakamura, entitled "METHOD FOR GROWTH OF SEMIPOLAR (Al, In, Ga, B) N OPTOELECTRONICS DEVICES,";

U.S. patent application Ser. No. 10/537,644, filed Jun. 6, 2005, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,", which application claims the benefit under 35 U.S.C. Section 365(c) of International Patent Application No. PCT/US03/21918, filed Jul. 15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,", which application claims the benefit under 35 U.S.C. Section 119(e) of U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,";

U.S. Utility patent application Ser. No. 10/537,385, filed Jun. 3, 2005, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY,", which application claims the benefit under 35 U.S.C. Section 365(c) of International Patent Application No. PCT/US03/21916, filed Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY,", which application claims the benefit under 35 U.S.C. Section 119(e) of U.S. Provisional Patent Application Ser. No. 60/433,844, filed Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY,";

U.S. Utility patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION,", which application claims the benefit under 35 U.S.C. Section 119(e) of U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

U.S. Utility patent application Ser. No. 10/413,690, filed Apr. 15, 2003, by Michael D. Craven, Stacia Keller, Steven P. DenBaars, Tal Margalith, James S. Speck, Shuji Nakamura, and Umesh K. Mishra, entitled "NON-POLAR (Al, B, In, Ga)N QUANTUM WELL AND HETEROSTRUCTURE MATERIALS AND DEVICES, which application claims the benefit under 35 U.S.C. Section 119(e) of U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

U.S. Utility patent application Ser. No. 10/413,913, filed Apr. 15, 2003, by Michael D. Craven, Stacia Keller, Steven P. DenBaars, Tal Margalith, James S. Speck, Shuji Nakamura, and Umesh K. Mishra, entitled "DISLOCATION REDUCTION IN NON-POLAR GALLIUM NITRIDE THIN FILMS,", which application claims the benefit under 35 U.S.C. Section 119(e) of U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,";

International Patent Application No. PCT/US03/39355, filed Dec. 11, 2003, by Michael D. Craven and Steven P. DenBaars, entitled "NONPOLAR (Al, B, In, Ga)N QUANTUM WELLS,", which application is a continuation-in-part of the above-identified Patent Application Nos. PCT/U503/21918 (30794.93-WO-U1), PCT/US03/21916 (30794.94-WO-U1), Ser. No. 10/413,691 (30794.100-US-U1), Ser. No. 10/413,690 (30794.101-US-U1), Ser. No. 10/413,913 (30794.102-US-U1);

all of which applications are incorporated by reference herein.

BACKGROUND OF THE INVENTION

1. Field of the Invention

The present invention relates to a technique for the growth of planar semi-polar gallium nitride.

2. Description of the Related Art

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. Group III and nitrogen atoms occupy alternating c-planes along the crystal's c-axis. The symmetry elements included in the würtzite structure dictate that III-nitrides possess a bulk spontaneous polarization along this c-axis, and the würtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on non-polar planes of the crystal. Such planes contain equal numbers of Ga and N atoms and are charge-neutral. Furthermore, subsequent non-polar layers are equivalent to one another so the bulk crystal will not be polarized along the growth direction. Two such families of symmetry-equivalent non-polar planes in GaN are the $\{11\bar{2}0\}$ family, known collectively as a-planes, and the $\{1\bar{1}00\}$ family, known collectively as m-planes. Unfortunately, despite advances made by researchers at the University of California, for example, as described in the applications cross-referenced above, growth of non-polar GaN remains challenging and has not yet been widely adopted in the III-nitride industry.

Another approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero 1 Miller index. Some commonly observed examples of semi-polar planes in c-plane GaN heteroepitaxy include the $\{11\bar{2}2\}$, $\{10\bar{1}1\}$, and $\{10\bar{1}3\}$ planes, which are found in the facets of pits. These planes also happen to be the same planes that the inventors have grown in the form of planar films. Other examples of semi-polar planes in the würtzite crystal structure include, but are not limited to, $\{10\bar{1}2\}$, $\{20\bar{2}1\}$, and $\{10\bar{1}4\}$. The nitride crystal's polarization vector lies neither within such planes or normal to such planes, but rather lies at some angle inclined relative to the plane's surface normal. For example, the $\{10\bar{1}1\}$ and $\{10\bar{1}3\}$ planes are at 62.98° and 32.06° to the c-plane, respectively.

The other cause of polarization is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

The advantage of using semi-polar planes over c-plane nitrides is that the total polarization will be reduced. There may even be zero polarization for specific alloy compositions on specific planes. Such scenarios will be discussed in detail in future scientific papers. The important point is that the polarization will be reduced compared to that of c-plane nitride structures.

Bulk crystals of GaN are not available, so it is not possible to simply cut a crystal to present a surface for subsequent device regrowth. Commonly, GaN films are initially grown heteroepitaxially, i.e. on foreign substrates that provide a reasonable lattice match to GaN.

Semi-polar GaN planes have been demonstrated on the sidewalls of patterned c-plane oriented stripes. Nishizuka et al. have grown $\{11\bar{2}2\}$ InGaN quantum wells by this technique. (See Nishizuka, K., Applied Physics Letters, Vol. 85, No. 15, 11 Oct. 2004.) They have also demonstrated that the internal quantum efficiency of the semi-polar plane {11$\bar{2}$2} is higher than that of the c-plane, which results from the reduced polarization.

However, this method of producing semi-polar planes is drastically different than that of the present invention; it is an artifact from epitaxial lateral overgrowth (ELO). ELO is used to reduce defects in GaN and other semiconductors. It involves patterning stripes of a mask material, often $SiO_2$ for GaN. The GaN is grown from open windows between the mask and then grown over the mask. To form a continuous film, the GaN is then coalesced by lateral growth. The facets of these stripes can be controlled by the growth parameters. If the growth is stopped before the stripes coalesce, then a small area of semi-polar plane can be exposed. The surface area may be 10 μm wide at best. Moreover, the semi-polar plane will be not parallel to the substrate surface. In addition, the surface area is too small to process into a semi-polar LED. Furthermore, forming device structures on inclined facets is significantly more difficult than forming those structures on normal planes.

The present invention describes a technique for the growth of planar films of semi-polar nitrides, in which a large area of (Al, In, Ga)N is parallel to the substrate surface. For example, samples are often grown on 10 mm×10 mm or 2 inch diameter substrates compared to the few micrometer wide areas previously demonstrated for the growth of semi-polar nitrides.

SUMMARY OF THE INVENTION

The present invention describes a method for growing semi-polar nitrides as planar films, such as {10$\bar{1}$1}, {10$\bar{1}$3}, and {11$\bar{2}$2} planar films of GaN. Growth of semi-polar nitride semiconductors offer a means of reducing polarization effects in würtzite-structure III-nitride device structures.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Growth of semi-polar nitride semiconductors, for example, {10$\bar{1}$1}, {10$\bar{1}$3} and {11$\bar{2}$2} planes of GaN, offer a means of reducing polarization effects in würtzite-structure III-nitride device structures. The semiconductor term nitrides refers to (Ga,Al,In,B)N and any alloy composition of these semiconductors. Current nitride devices are grown in the polar [0001] c-direction, which results in charge separation along the primary conduction direction in vertical devices. The resulting polarization fields are detrimental to the performance of current state of the art optoelectronic devices. Growth of these devices along a semi-polar direction could improve device performance significantly by reducing built-in electric fields along the conduction direction.

Until now, no means existed for growing large area, high quality films of semi-polar nitrides suitable for use as device layers, templates, or substrates in device growth. The novel feature of this invention is the establishment that semi-polar nitrides can be grown as planar films. As evidence, the inventors have grown {10$\bar{1}$1}, {10$\bar{1}$3}, and {11$\bar{2}$2} planar films of GaN. However, the scope of this idea is not limited to solely these examples. This idea is relevant to all semi-polar planar films of nitrides.

Technical Description

Figure 1A:
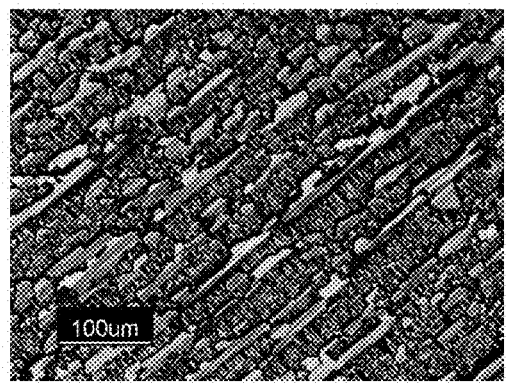
FIGS. 1A, 1B and 1C are optical micrographs of GaN on (100) spinel with substrate miscuts of FIG. 1A (no miscut), FIG. 1B (miscut in <010>), and FIG. 1C (miscut in <011>).
Figure 1B:
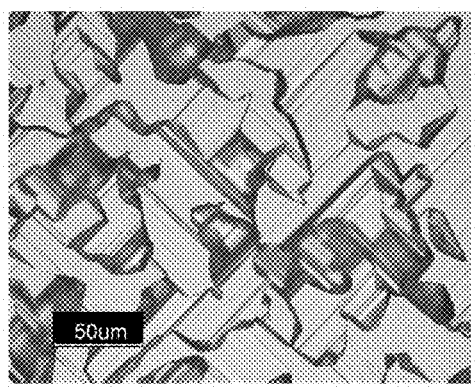

The present invention comprises a method for growing planar nitride films in which a large area of the semi-polar nitrides is parallel to a substrate surface. Examples of this are {10$\bar{1}$1} and {10$\bar{1}$3} GaN films. In this particular embodiment, $MgAl_2O_4$ spinel substrates are used in the growth process. It is critically important that the spinel is miscut in the proper direction for growth of {10$\bar{1}$1} GaN. {10$\bar{1}$1} GaN grown on {100} spinel that is on-axis and that is miscut toward the <001> direction will have two domains at 90° to each other. This is apparent in the optical micrographs of GaN on (100) spinel shown in FIG. 1A (no miscut) and FIG. 1B (a miscut in <010>), respectively.

Figure 1C:
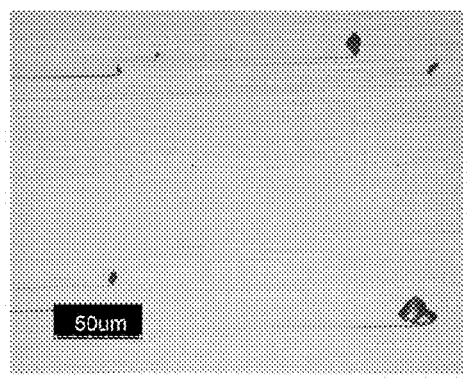

However, {10$\bar{1}$1} single crystal GaN grows on {100} spinel that is miscut in the <011>, as shown in the optical micrograph of GaN on (100) spinel in FIG. 1C (a miscut in <011>) X-ray diffraction (XRD) was used to verify that the films grown on (100) spinel with miscut toward <011> direction are single crystal and that the films grown on-axis or miscut toward <010> direction have two domains.

{10$\bar{1}$3} single crystal GaN was grown on nominally on-axis (lacking an intentional miscut) {110} spinel. XRD was used to verify that the {10$\bar{1}$3} GaN is single crystal.

Also, planar films of {11$\bar{2}$2} GaN and {10$\bar{1}$3} GaN have been grown on m-plane sapphire, {1$\bar{1}$00} $Al_2O_3$. It is uncommon in semiconductor growth for one substrate to be used for growth of two distinct planes of the same epitaxial material. However, the plane can be reproducibly selected by flowing ammonia at different temperatures before the GaN growth. Again, XRD was used to confirm the single crystal character of the films.

Thus, there has been experimentally proven four examples of planar semi-polar nitride films:

1) {10$\bar{1}$1} GaN on {100} spinel miscut in specific directions (<001>, <010> and <011>),
2) {10$\bar{1}$3} GaN on {110} spinel,
3) {11$\bar{2}$2} GaN on {1$\bar{1}$00} sapphire, and
4) {10$\bar{1}$3} GaN on {1$\bar{1}$00} sapphire.

These films were grown using an HVPE system in Shuji Nakamura's lab at the University of California, Santa Barbara. A general outline of growth parameters for both {10$\bar{1}$1} and {10$\bar{1}$3} is a pressure between 10 torr and 1000 ton, and a temperature between 900° C. and 1200° C. This wide range of pressure shows that these planes are very stable when growing on the specified substrates. The epitaxial relationships should hold true regardless of the type of reactor. However, the reactor conditions for growing these planes will vary according to individual reactors and grow methods (HVPE, MOCVD, and MBE, for example).

Process Steps

Figure 2:
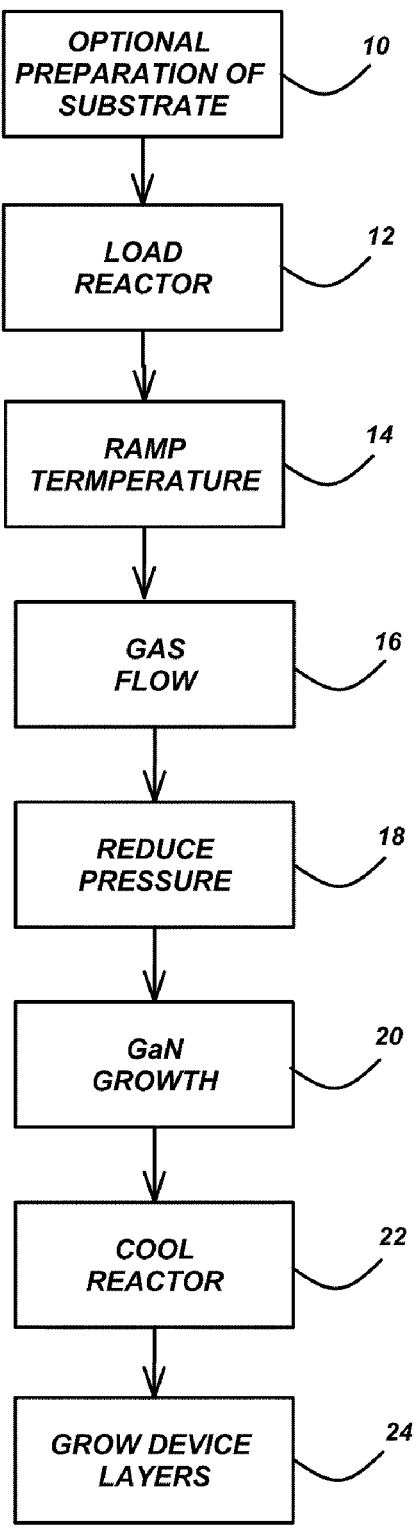
FIG. 2 is a flowchart illustrating the process steps of the preferred embodiment of the present invention.

FIG. 2 is a flowchart illustrating the process steps of the preferred embodiment of the present invention. Specifically, these process steps comprise a method for growing planar, semi-polar nitride films in which a large area of the planar, semi-polar nitride film is parallel to the substrate's surface.

Block 10 represents the optional step of preparing the substrate. For example, the preparation may involve performing a miscut of the substrate. For the growth of {10$\bar{1}$1} GaN, a (100) spinel substrate is used with a miscut in the <011> direction (which includes <010> and <011>). For the growth of {10$\bar{1}$3} GaN, an on-axis (110) spinel substrate is used. The (110) spinel may or may not have a miscut in any direction, but a miscut is not necessary as it is to grow {10$\bar{1}$1} GaN on (100) spinel.

Block 12 represents the step of loading the substrate into an HVPE reactor. The reactor is evacuated to at least 9E-2 ton to remove oxygen, then it is backfilled with nitrogen.

Block 14 represents the step of turning on the furnace and ramping the temperate of the reactor under conditions to encourage nitridization of the surface of the substrate.

Block 16 represents the step of performing a gas flow. The process generally flows nitrogen, hydrogen, and/or ammonia over the substrate at atmospheric pressure. Block 18 represents the step of reducing the pressure in the reactor. The furnace setpoint is 1000° C., and when it reaches this temperature, the pressure of the reactor is reduced to 62.5 torr.

Block 20 represents the step of performing a GaN growth. After the pressure is reduced, the ammonia flow is set to 1.0 slpm (standard liters per minute), and HCl (hydrogen chloride) flow over Ga (gallium) of 75 sccm (standard cubic centimeters per minute) is initiated to start the growth of GaN.

Block 22 represents the step of cooling down the reactor. After 20 to 60 minutes of GaN growth time, the HCl flow is stopped, and the reactor is cooled down while flowing ammonia to preserve the GaN film.

The end result of these steps comprises a planar, semi-polar nitride film in which a large surface area (at least 10 mm×10 mm or a 2 inch diameter) of the planar, semi-polar nitride film is parallel to the substrate's surface.

Although the process steps are described in conjunction with a spinel substrate, m-plane sapphire can be used to grow either {11$\bar{2}$2} GaN or {10$\bar{1}$3} GaN. The process is the same as described above, with one exception. For growth of {11$\bar{2}$2} GaN, ammonia is flowed while the furnace is ramping to the growth temperature, thus the nitridation occurs at low temperature. To select for {10$\bar{1}$3} GaN, only hydrogen and nitrogen can be flowed during the ramp temperature step. The substrate should then be subjected to a high temperature nitridation with ammonia flow at the growth temperature.

After the semi-polar film has been grown using the HVPE system, Block 22 represents the step of growing device layers on the substrate using MOCVD or MBE. This step usually involves doping the nitride layers with n-type and p-type, and growing one or several quantum wells in the regrowth layer. An LED can be made in this step using standard LED processing methods in a cleanroom.

Figure 3:
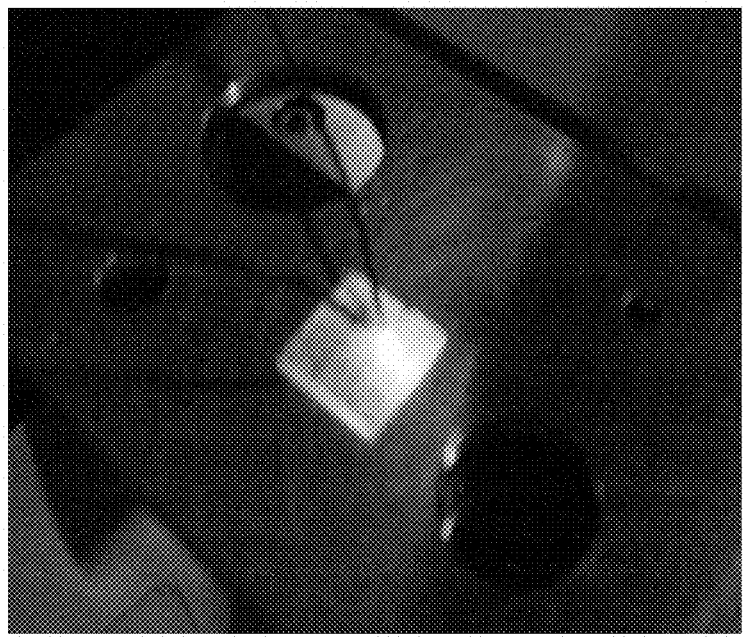
FIG. 3 is a photograph of an LED grown by MOCVD on a {10$\bar{1}$1} GaN template grown by HVPE.

FIG. 3 is a photograph of a green LED grown by MOCVD on a {10$\bar{1}$1} GaN template grown by HVPE. Specifically, the template was grown by the previously described HVPE growth process, and the LED structure was grown by MOCVD. This is the first {10$\bar{1}$1} GaN LED.

Possible Modifications and Variations

The scope of this invention covers more than just the particular examples cited. This idea is pertinent to all nitrides on any semi-polar plane. For example, one could grow {10$\bar{1}$1} AN, InN, AlGaN, InGaN, or AlInN on a miscut (100) spinel substrate. Another example is that one could grow {10$\bar{1}$2} nitrides, if the proper substrate is found. These examples and other possibilities still incur all of the benefits of planar semi-polar films.

The research that was performed in Shuji Nakamura's Lab at University of California, Santa Barbara, was done using HVPE; however, direct grow of semi-polar planes of nitrides should be possible using MOCVD and MBE as well. The epitaxial relations should be the same for most growth method, although it can vary as seen in the example of GaN on m-plane sapphire. For example, an MOCVD grown {10$\bar{1}$1} GaN LED could be grown directly on miscut (100) spinel without an HVPE template. This idea covers any growth technique that generates a planar semi-polar nitride film.

The reactor conditions will vary by reactor type and design. The growth described here is only a description of one set of conditions that has been found to be useful conditions for the growth of semi-polar GaN. It was also discovered that these films will grow under a wide parameter space of pressure, temperature, gas flows, etc., all of which will generate planar semi-polar nitride film.

There are other steps that could vary in the growth process. A nucleation layer has been found unnecessary for our reactor conditions; however, it may or may not be necessary to use a nucleation layer for other reactors, which is common practice in the growth of GaN films. It has also been found that nitridizing the substrate improves surface morphology for some films, and determines the actual plane grown for other films. However, this may or may not be necessary for any particular growth technique.

Advantages and Improvements

The existing practice is to grow GaN with the c-plane normal to the surface. This plane has a spontaneous polarization and piezoelectric polarization which are detrimental to device performance. The advantage of semi-polar over c-plane nitride films is the reduction in polarization and the associated increase in internal quantum efficiency for certain devices.

Non-polar planes could be used to completely eliminate polarization effects in devices. However, these planes are quite difficult to grow, thus non-polar nitride devices are not currently in production. The advantage of semi-polar over non-polar nitride films is the ease of growth. It has been found that semi-polar planes have a large parameter space in which they will grow. For example, non-polar planes will not grow at atmospheric pressure, but semi-polar planes have been experimentally demonstrated to grow from 62.5 torr to 760 torr, but probably have an even wider range than that. {1$\bar{1}$00} GaN is grown at low pressure, but when the pressure is increased to 760 ton, all other things being equal, c-plane GaN will result. This is probably related to the outline of the unit cell for the two planes. A further difficulty of {11$\bar{2}$0} GaN is In incorporation for InGaN devices. Results have found In incorporation to be quite favorable for {10$\bar{1}$1} GaN.

The advantage of planar semi-polar films over ELO sidewall is the large surface area that can be processed into an LED or other device. Another advantage is that the growth surface is parallel to the substrate surface, unlike that of ELO sidewall semi-polar planes.

In summary, the present invention establishes that planar semi-polar films of nitrides can be grown. This has been experimentally confirmed for four separate cases. The previously discussed advantages will be pertinent to all planar semi-polar films.

REFERENCES

The following references are incorporated by reference herein:

[1] Takeuchi, Tetsuya, Japanese Journal of Applied Physics, Vol. 39, (2000), pp. 413-416. This paper is a theoretical study of the polarity of semi-polar GaN films.

[2] Nishizuka, K., Applied Physics Letters, Vol. 85 No. 15, 11 Oct. 2004. This paper is a study of {11$\bar{2}$2} GaN sidewalls of ELO material.

[3] T. J. Baker, B. A. Haskell, F. Wu, J. S. Speck, and S. Nakamura, "Characterization of Planar Semipolar Gallium Nitride Films on Spinel Substrates," Japanese Journal of Applied Physics, Vol. 44, No. 29, (2005), L920.

[4] A. Chakraborty, T. J. Baker, B. A. Haskell, F. Wu, J. S. Speck, S. P. Denbaars, S. Nakamura, and U. K. Mishra, "Milliwatt Power Blue InGaN/GaN Light-Emitting Diodes on Semipolar GaN Templates," Japanese Journal of Applied Physics, Vol. 44, No. 30 (2005), L945.

[5] R. Sharma, P. M. Pattison, H. Masui, R. M. Farrell, T. J. Baker, B. A. Haskell, F. Wu, S. P. Denbaars, J. S. Speck, and S. Nakamura, "Demonstration of a Semipolar (10-1-3) InGaN/GaN Green Light Emitting Diode," Appl. Phys. Lett. 87, 231110 (2005).

[6] T. J. Baker, B. A. Haskell, F. Wu, J. S. Speck, and S. Nakamura, "Characterization of Planar Semipolar Gallium Nitride Films on Sapphire Substrates," Japanese Journal of Applied Physics, Vol. 45, No. 6, (2006), L154.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A nitride film, comprising:
a semi-polar nitride film grown on a semi-polar plane of a substrate, such that a surface of the semi-polar nitride film is planar and parallel to a surface of the semi-polar plane of the substrate.

2. The film of claim 1, wherein the semi-polar film reduces polarization in device layers grown on the semi-polar film as compared to device layers grown on a c-plane polar nitride film, the polarization resulting from the device layers and the films having dissimilar compositions and therefore different lattice constants.

3. The film of claim 1, wherein the semi-polar nitride film is a {10-11} nitride, {10-13} nitride, {10-14} nitride, {11-22} nitride, or {20-21} nitride.

4. The film of claim 1, wherein the substrate is a {100} substrate miscut in a specific direction to create the surface of the semi-polar plane of the substrate, and the specific direction comprises a <001>, <010> or <011> direction.

5. The film of claim 1, wherein the semi-polar nitride film is a {10-11} nitride grown on a (100) spinel substrate miscut in a specific direction, and the specific direction comprises a <001>, <010> or <011> direction.

6. The film of claim 1, wherein the semi-polar nitride film is a {10-13} nitride grown on a {110} spinel substrate.

7. The film of claim 1, wherein the semi-polar nitride film is a {10-13} nitride grown on a {1-100} sapphire substrate.

8. The film of claim 1, wherein the semi-polar nitride film is a {11-22} nitride grown on a {1-100} sapphire substrate.

9. A method for growing a nitride film, comprising:
growing a semi-polar nitride film on a semi-polar plane of a substrate, such that a surface of the semi-polar nitride film is planar and parallel to a surface of the semi-polar plane of the substrate.

10. The method of claim 9, wherein the semi-polar film reduces polarization in device layers grown on the semi-polar film as compared to device layers grown on a c-plane polar nitride film, the polarization resulting from the device layers and the films having dissimilar compositions and therefore different lattice constants.

11. The method of claim 9, wherein the semi-polar nitride film is a {10-11} nitride, {10-13} nitride, {10-14} nitride, {11-22} nitride, or {20-21} nitride.

12. The method of claim 9, wherein the substrate is a {100} substrate miscut in a specific direction to create the surface of the semi-polar plane of the substrate, and the specific direction comprises a <001>, <010>or <011> direction.

13. The method of claim 9, wherein the semi-polar nitride film is a {10-11} nitride grown on a (100) spinel substrate miscut in a specific directions, and the specific direction comprises a <001>, <010> or <011>direction.

14. The method of claim 9, wherein the semi-polar nitride film is a {10-13} nitride grown on a {110} spinel substrate.

15. The method of claim 9, wherein the semi-polar nitride film is a {10-13} nitride grown on a {1-100} sapphire substrate.

16. The method of claim 9, wherein the semi-polar nitride film is a {11-22} nitride grown on a {1-100} sapphire substrate.

* * * * *